United States Patent
Perlov et al.

(10) Patent No.: US 6,690,597 B1
(45) Date of Patent: Feb. 10, 2004

(54) MULTI-BIT PROM MEMORY CELL

(75) Inventors: Craig M. Perlov, San Mateo, CA (US); Ping Mei, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/422,439

(22) Filed: Apr. 24, 2003

(51) Int. Cl.$^7$ .......................... G11C 7/00; H03K 19/173
(52) U.S. Cl. ...................... 365/94; 365/96; 365/100; 365/105
(58) Field of Search ................ 365/94, 96, 100, 365/105, 225.7

(56) References Cited

U.S. PATENT DOCUMENTS 5,200,652 A * 4/1993 Lee .............................. 326/47
5,412,593 A * 5/1995 Magel et al. ................. 365/96

* cited by examiner

*Primary Examiner*—Vu A. Le

(57) ABSTRACT

A memory cell comprises at least two antifuses in series with a diode. Each antifuse expresses a different resistance from the others when blown, and each requires an escalating programming voltage over the last to be programmed. The antifuse structures differ in their respective geometries and materials so that a low programming voltage will blow the more sensitive fuse first, and a higher voltages will program the lesser sensitive fuses thereafter.

14 Claims, 4 Drawing Sheets

MULTI-BIT PROM MEMORY CELL

FIELD OF THE INVENTION

The present invention relates to semiconductor digital memories, and more specifically to memory cell structures that permit more than one binary bit to be stored and accessed.

BACKGROUND OF THE INVENTION

Semiconductor digital memories typically comprise arrays of memory cells that store one binary bit capable of two states, e.g., "1" or "0". Fuse and antifuse memory bit cells represent the binary states of "1" and "0" by the condition of the fuse, e.g., open =1, and closed =0, or vice versa. A diode is usually included at each fuse location to make each bit in an array readable one at a time using bit and word address lines. Such diodes are reverse-biased if the row and column of the bit are not being addressed, and forward-biased if they are being addressed.

An antifuse is the opposite of a regular fuse, an antifuse is normally an open circuit until a programming current, e.g., about five milliamperes, is forced through it. Poly-diffusion antifuses, e.g., use heat generated by high current densities to melt a thin insulating dielectric layer between electrodes. The programming current drives dopant atoms from the polysilicon and diffusion electrodes into a resistive silicon link about twenty nanometers in diameter results. Actel refers to its antifuse technology as programmable low-impedance circuit element (PLICE).

A typical poly-diffusion antifuse oxide-nitride-oxide (ONO) dielectric sandwich comprises silicon dioxide ($SiO_2$) grown over an n-type antifuse diffusion, a silicon nitride ($Si_3N_4$) layer, and another thin silicon dioxide ($SiO_2$) layer. An antifuse such as this with a layered ONO-dielectric structure has narrower range of blown antifuse resistance values, as compared to a single-oxide dielectric. The effective electrical thickness the layered ONO-dielectric structure is equivalent to ten nanometers of $SiO_2$ The $Si_3N_4$ has a higher dielectric constant than $SiO_2$, so the actual thickness can be less than ten nanometers.

The average resistance of a blown antifuse depends on the fabrication process and the programming current used. In one particular technology, a programming current of five milliamperes may result in an average blown antifuse resistance of about 500-ohms. The correct level of switch current depends on the device size and the top meal used. Increasing the programming current to fifteen milliamperes typically reduces the average antifuse resistance, e.g., to 100-ohms. Conducting filaments of metal are assumed to be the principle vehicle for current flow after programming the switch. The typical on-to-off resistance ratio is on the order of 1:100,000.

Once an antifuse is programmed, the process cannot be reversed. An Actel 1010, for example, contains about 112,000 antifuses, but only two percent of the fuses are ever programmed in a typical application.

SUMMARY OF THE INVENTION

An object of the present invention is to provide a memory cell structure for increased bit storage densities.

Briefly, a memory cell embodiment of the present invention comprises at least two antifuses in series with a diode. Each antifuse expresses a different resistance from the others when blown, and each requires an escalating programming voltage or current over the last to be programmed. The antifuse structures differ in their respective geometries and materials so that a low programming voltage will blow the more sensitive fuse first, and a higher voltages will program the lesser sensitive fuses thereafter.

An advantage of the present invention is that a memory device is provided that has a high bit density.

Another advantage of the present invention is that a memory device is provided that can be expanded vertically in additional layers.

These and other objects and advantages of the present invention will no doubt become obvious to those of ordinary skill in the art after having read the following detailed description of the preferred embodiment as illustrated in the drawing figures.

DETAILED DESCRIPTION OF THE EMBODIMENTS

Figure 1A:
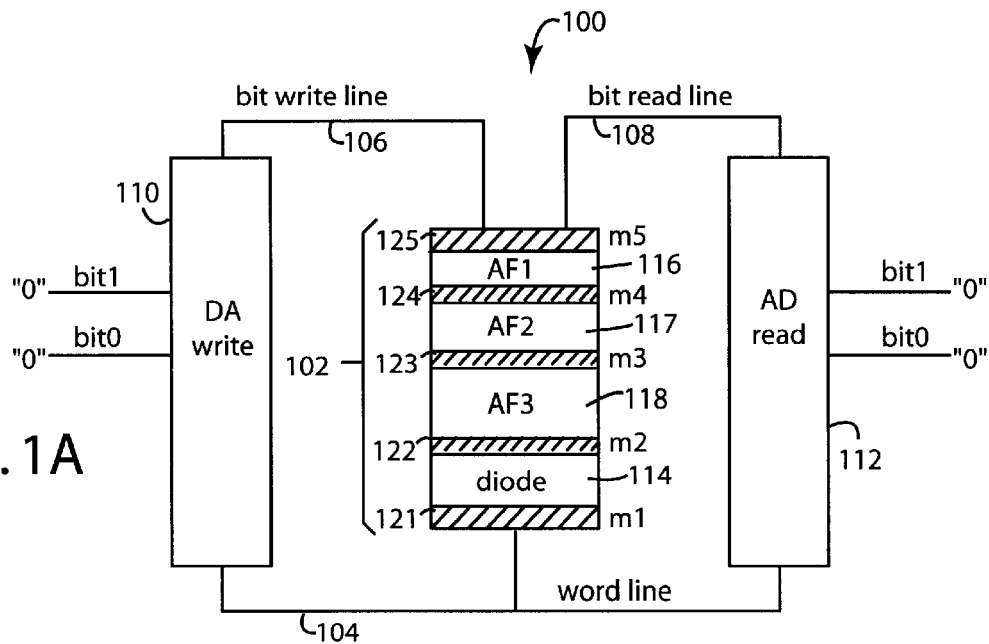
FIG. 1A is a schematic diagram of a memory cell embodiment of the present invention that uses three antifuse devices to represent two binary bits of information, and the three antifuses not yet programmed here represent a binary state of "00"
Figure 1B:
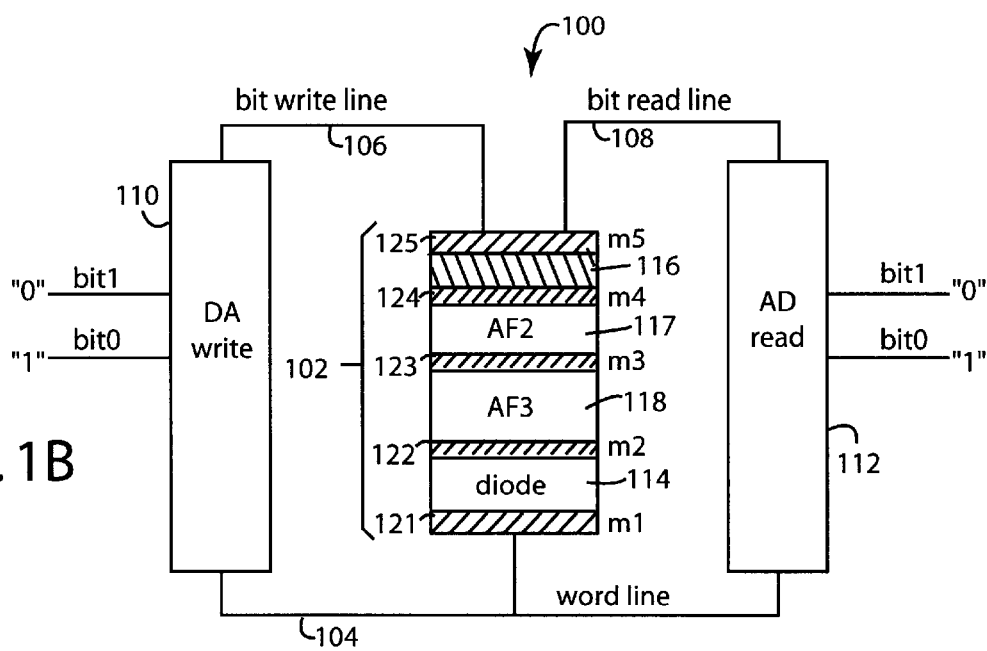
FIG. 1B is a schematic diagram of the memory cell of FIG. 1A, wherein a first of the three antifuses programmed here and represent a binary state of "01"
Figure 1C:
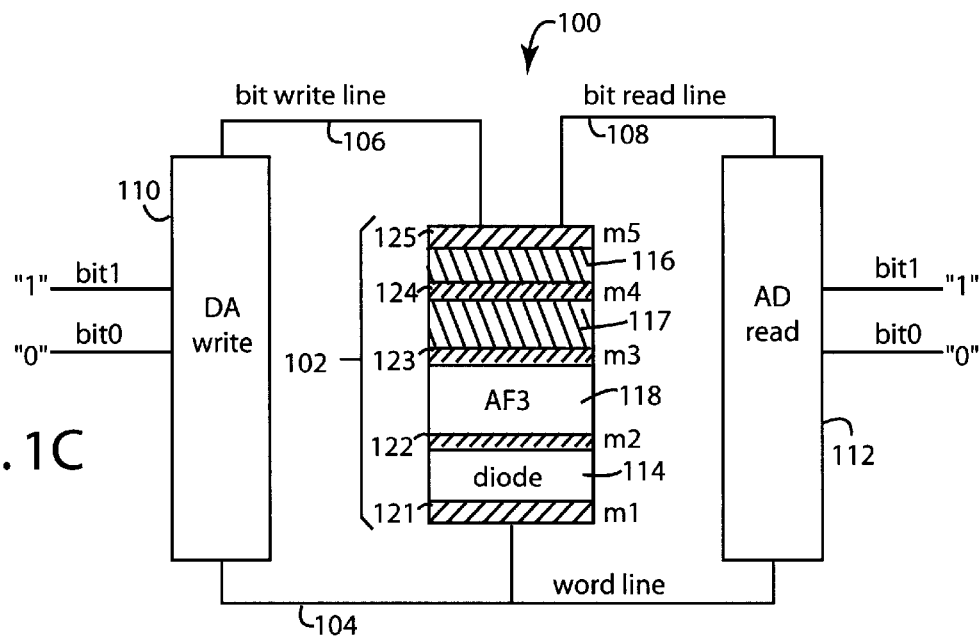
FIG. 1C is a schematic diagram of the memory cell of FIG. 1A, wherein the first and second of the three antifuses are programmed to represent a binary state of "10"
Figure 1D:
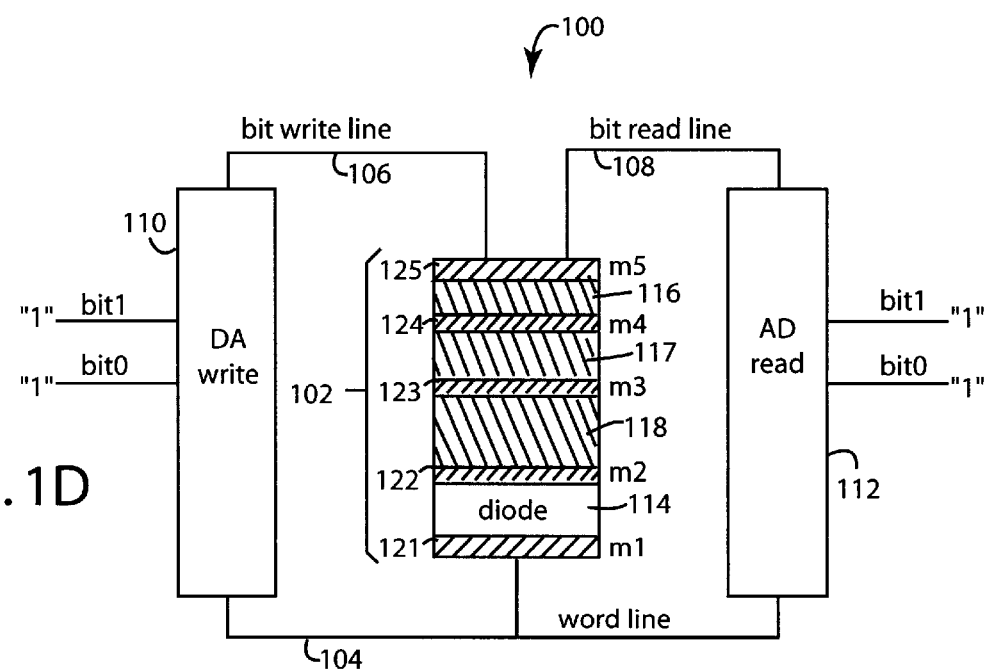
FIG. 1D is a schematic diagram of the memory cell of FIG. 1A, wherein all of the three antifuses are programmed to represent a binary state of "11"

FIGS. 1A–1D illustrate a multi-bit memory-cell system embodiment of the present invention, and is referred to herein by the general reference numeral 100. A single memory cell 102 represents many such devices that are arrayed on a crossbar matrix of bit lines and word lines. For example, a word line 104, a bit write line 106, and a bit read line 108 provide write/read access of particular memory cells 102, respectively, to a write encoder amplifier 110 and a read decoder amplifier 112.

The memory cell 102 comprises a series stack of one diode and at least two programmable switches. FIGS. 1A–1D represent one embodiment that is possible, e.g., a series stack comprising a diode 114 and three antifuse switches (AF1–AF3) 116–118. A metal layer (m1–m5) 121–125 separates each component. Metal layers m1 121 and m5 125 allow connection to word line 104, bit write line 106, and bit read line 108. Such can be fabricated using aluminum, gold, chromium, tungsten-titanium, etc. The choice of metals used also affects the programming switch point voltages and currents.

Metal layers m2–m3 122–124 preferably comprise a metal, like chromium or tungsten-titanium, chosen to help isolate the transition of one antifuse AF1–AF3 116–118 from unprogrammed to programmed. Without the metal layers m2–m3 122–124, the amorphous silicon heating during programming can bleed over to the next antifuse and program it too.

The read decoder amplifier 112 therefore detects how many of the antifuses AF1–AF3 116–118 have been programmed by sensing the overall series resistance of the memory cell 102. A sense current can be injected to measure such resistance value.

Such representative device can store two binary bits of information, e.g., four states, 00, 01, 10, and 11. These are respectively represented in FIGS. 1A–1D by (00) AF1=open, AF2=open, AF3=open; (01) AF1=closed, AF2=open, AF3=open; (10) AF1=closed, AF2=closed, AF3=open; and, (11) AF1=closed, AF2=closed, AF3=closed. The nature of the semiconductor device structure is that AF1 must be closed by write programming before AF2 can be closed, and AF2 must be closed before AF3 can be closed.

The three antifuse switches (AF1–AF3) 116–118 are electrically in series and differ amongst themselves in how strong an electric field is needed to cause an avalanche breakdown of the amorphous. silicon. A straightforward way to implement this is to make AF1 then thinnest and closest to the fifth metal layer (m5).

The write encoder amplifier 110 is basically a digital-to-analog converter that converts the binary information at its input to a corresponding programming voltage level at its output on bit write line 106. State-00 requires no programming voltage, state-01 requires enough voltage on bit write line 106 to generate an electric field at metal layer m5 125 to avalanche AF1 116. State-10 requires the voltage on bit write line 106 to raise the electric field at metal layer m5 125 enough to avalanche AF2 117. And state-11 requires the voltage on bit write line 106 to raise the electric field still further at metal layer m5 125 to avalanche AF3 118. In fact, once AF1 116 has switched on, the important electrode involved in the avalanching of AF2 117 will be metal layer m4 124 because it is now shorted to metal layer m5 125. And once AF2 117 has switched on, the important electrode involved in the avalanching of AF3 118 will be metal layer m3 123 because it is now shorted through AF1 and AF2 to metal layer m5 125.

More bits may be stored in memory cell 102 by adding additional antifuse devices.

Figure 2A:
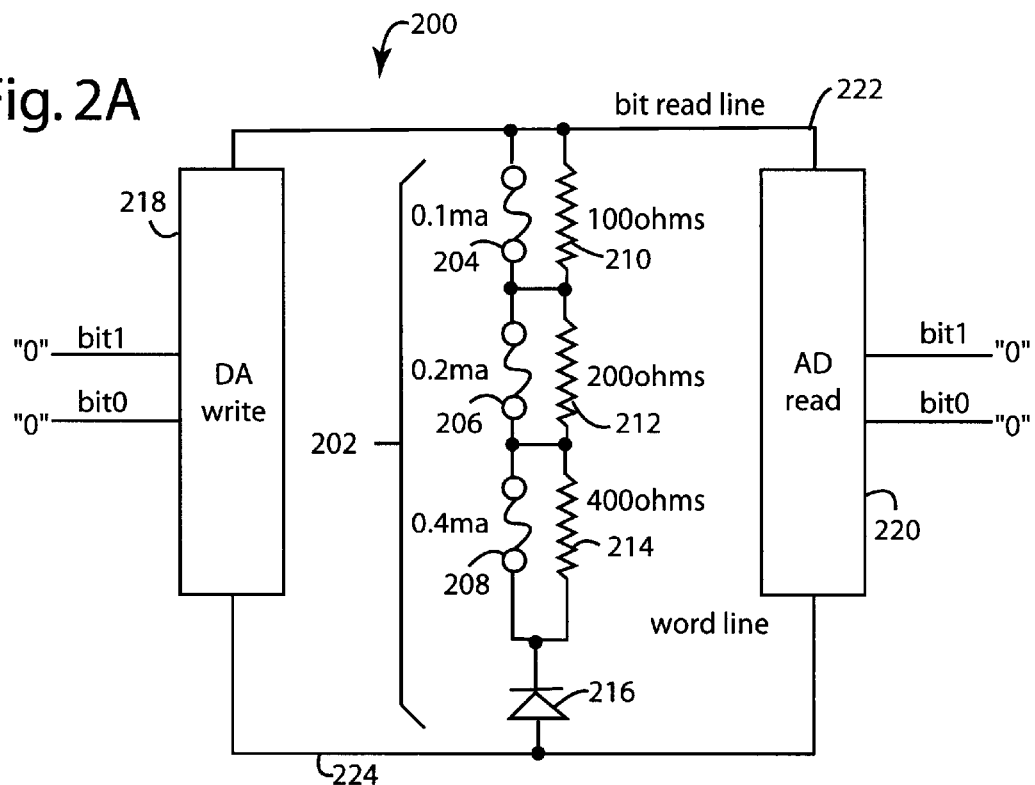
FIG. 2A is a schematic diagram of a memory cell embodiment of the present invention that uses three fuse devices to represent two binary bits of information, and the three fuses not yet programmed here represent a binary state of "00"
Figure 2B:
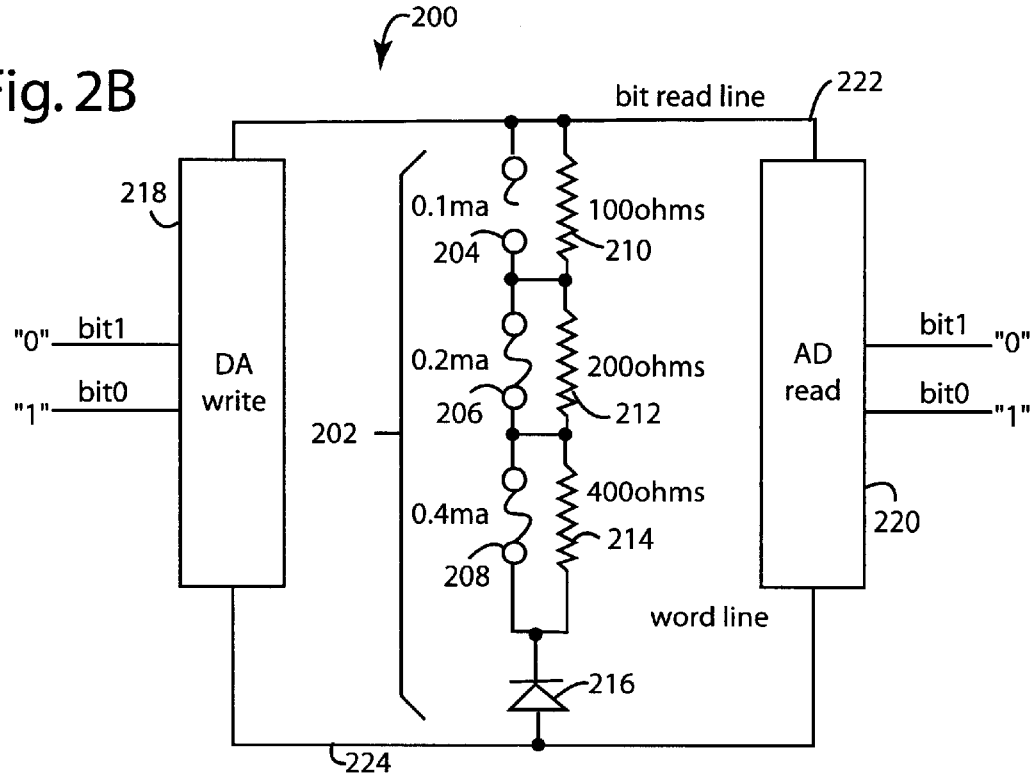
FIG. 2B is a schematic diagram of the memory cell of FIG. 2A, wherein a first of the three fuses is programmed here and represents a binary state of "01"
Figure 2C:
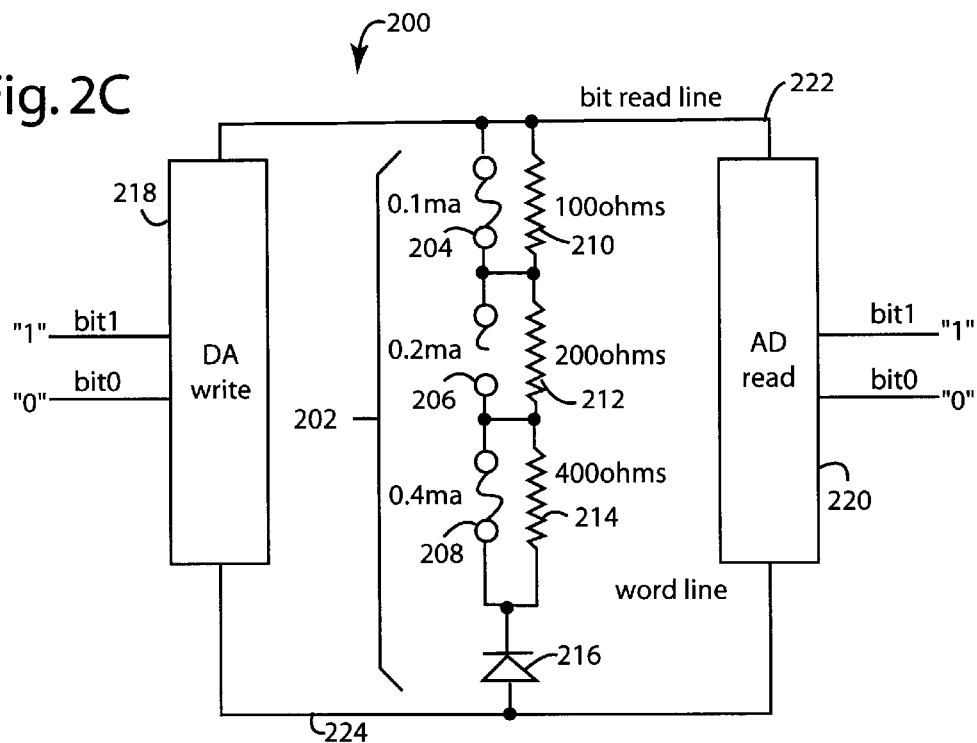
FIG. 2C is a schematic diagram of the memory cell of FIG. 2A, wherein the first and second of the three fuses are programmed here to represent a binary state of "10"
Figure 2D:
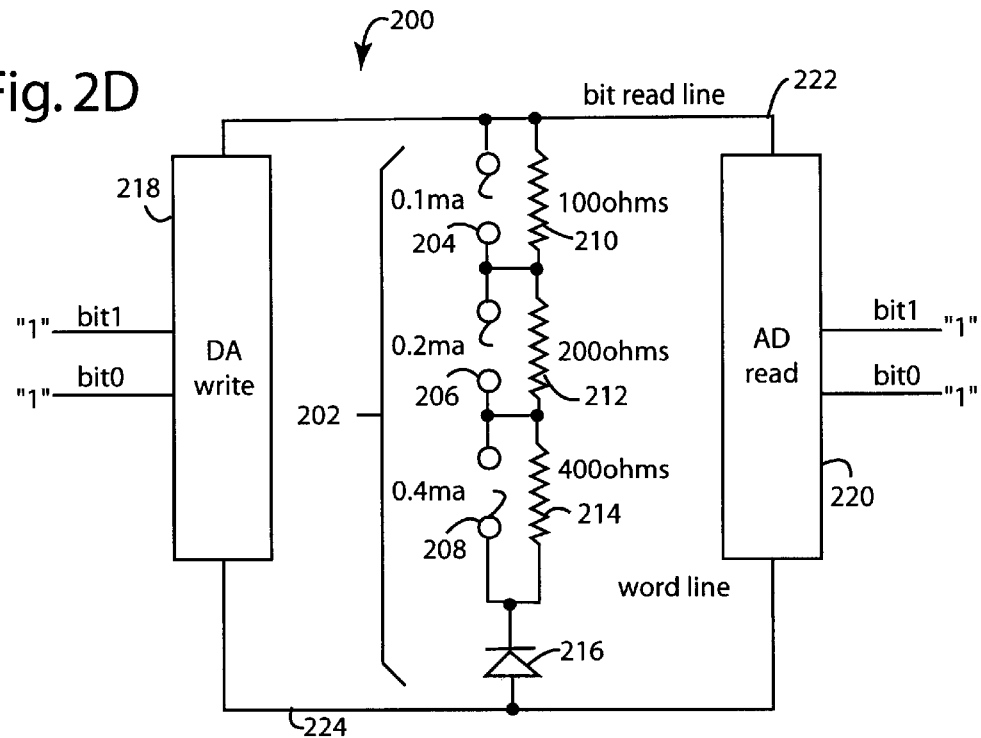
FIG. 2D is a schematic diagram of the memory cell of FIG. 2A, wherein all of the three fuses are programmed to represent a binary state of "11".

FIGS. 2A–2D illustrate another multi-bit memory-cell system embodiment of the present invention, and is referred to herein by the general reference numeral 200. The memory-cell system 200 is similar in concept to memory-cell system 100, except that the principle memory storage elements are fuses each paralleled by a unique resistance.

The memory-cell system 200 comprises at least one memory cell 202 in which at least two fuses paralleled by respective unique resistances are placed in a series stack. The fuses themselves and the resistors can be discrete devices, or the resistances can represent the predictable electrical resistive aftermath of having blown a corresponding fuse. Many conventional technologies are available to artisans, e.g., PEDT:PSS a conducting polymer fuse. The choice of technologies used to implement system 200 or memory cell 202 are not critical.

FIGS. 2A–2D illustrate a particular three-fuse embodiment of the memory cell 202. It is only necessary to have at least two such fuses. The maximum number will be limited by the programming voltages the semiconductor device can tolerate in order to program the "nth" fuse. Here, a first fuse 204 is placed in series with a second and a third fuse 206 and 208. Each is respectively engineered to open-up at a different programming current. The programming currents listed in FIGS. 2A–2D are merely examples for discussion here, e.g., 0.1, 0.2, and 0.4 milliamperes. These are respectively paralleled by first through third resistors 210, 212, and 214. The resistor values listed in FIGS. 2A–2D are also merely examples for discussion here, e.g., 100-ohms, 200-ohms, and 400-ohms. The whole stack of fuses and resistors is in series with a diode 216 that makes the memory cell 202 addressable in an array of such memory cells.

A digital-analog write encoder 218 converts a two-bit digital input into a programming current, e.g., "100"<0.1 mA, "01" is 0.1–0.2 mA, "10" is 0.2–0.4 mA, and "11" is over 0.4 mA. The application of such levels is respectively represented in FIGS. 2A, 2B, 2C, and 2D.

An analog-digital read decoder 220 converts a resistance reading back into the original two-bit digital value, e.g., "00" for about 0-ohms, "01" for about 100-ohms, "10" for about 300-ohms, and "11" for about 700-ohms. The reading of such levels is respectively represented in FIGS. 2A, 2B, 2C, and 2D. Notice the difference in which fuses 204, 206, and 208 are blown between the FIGS.

The digital-analog write encoder 218 and analog-digital read decoder 220 are able to address each memory cell 202 through a bit line 222 and a word line 224.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A multi-bit memory cell, comprising:
   a first antifuse providing for programming to a lower first resistance when a programming voltage exceeding a first programming voltage level is exceeded; and
   a second antifuse in electrical series with the first antifuse and providing for programming to a lower second resistance when said programming voltage exceeds a second programming voltage level.

2. The multi-bit memory cell of claim 1, further comprising:
   at least one additional antifuse in electrical series with the first and second antifuses and providing for programming to a resistance different than said first and second resistances when said programming voltage exceeds a programming voltage level substantially exceeding said second programming voltage level.

3. The multi-bit memory cell of claim 1, further comprising:
   a write encoder amplifier for selectively applying said programming voltage that exceeds a particular programming voltage level, wherein such selection depends on a multi-bit binary value to be stored.

4. The multi-bit memory cell of claim 1, further comprising:
   a read decoder amplifier for outputting a multi-bit binary value that depends on a reading of a programmed state of any antifuse in electrical series with the first antifuse.

5. A method for storing multi-bit binary values in a single memory cell, the method comprising the steps of:
arranging dissimilar antifuse devices in electrical series with one another, wherein the dissimilarity is such that differing programming voltage levels are required to uniquely program particular ones of said antifuse devices;
programming particular ones of said antifuse devices by applying a programming voltage level that represents an encoding of a multi-bit binary value; and
reading back said multi-bit binary value by sensing how many of said dissimilar antifuse devices have reacted to said programming voltage level.

6. The method of claim 5, wherein:
the step of arranging is such that said dissimilar antifuse devices each represent discrete changes in geometries with a most sensitive type disposed on an end.

7. The method of claim 5, wherein:
the step of arranging is such that said dissimilar antifuse devices are in series with a diode that enables the step of reading back from an array of memory cells with a word-line and a bit-line.

8. A multi-bit memory cell, comprising:
a first fuse providing for programming to a higher first resistance when a programming current exceeding a first programming current level is exceeded; and
a second fuse in electrical series with the first fuse and providing for programming to a different higher second resistance when said programming current exceeds a second programming current level.

9. The multi-bit memory cell of claim 8, further comprising:
an additional fuse in electrical series with the first and second fuses and providing for programming to a resistance different than said first and second resistances when said programming current exceeds a programming current level substantially exceeding said second programming current level.

10. The multi-bit memory cell of claim 8, further comprising:
a write encoder amplifier for selectively applying said programming current that exceeds a particular programming current level, wherein such selection depends on a multi-bit binary value to be stored.

11. The multi-bit memory cell of claim 8, further comprising:
a read decoder amplifier for outputting a multi-bit binary value that depends on a reading of a programmed state of any fuse in electrical series with the first fuse.

12. A method for storing multi-bit binary values in a single memory cell, the method comprising the steps of:
arranging dissimilar fuse devices in electrical series with one another, wherein the dissimilarity is such that differing programming current levels are required to uniquely program particular ones of said fuse devices;
programming particular ones of said fuse devices by applying a programming current level that represents an encoding of a multi-bit binary value; and
reading back said multi-bit binary value by sensing how many of said dissimilar fuse devices have reacted to said programming current level.

13. The method of claim 12, wherein:
the step of arranging is such that said dissimilar fuse devices each represent discrete steps in fusing values.

14. The method of claim 12, wherein:
the step of arranging is such that said dissimilar fuse devices are in series with a diode that enables the step of reading back from an array of memory cells with a word-line and a bit-line.

* * * * *